United States Patent
Moon et al.

(10) Patent No.: US 10,033,005 B2
(45) Date of Patent: Jul. 24, 2018

(54) STRETCHABLE SUBSTRATE, ELECTRONIC APPARATUS HAVING THE STRETCHABLE SUBSTRATE, AND METHOD OF MANUFACTURING THE ELECTRONIC APPARATUS

(71) Applicant: Electronics and Telecommunications Research Institute, Daejeon (KR)

(72) Inventors: Jaehyun Moon, Daejeon (KR); Chan Woo Park, Daejeon (KR); Nam Sung Cho, Daejeon (KR); Jun-Han Han, Daejeon (KR); Seung Koo Park, Daejeon (KR); Sung Ryul Yun, Daejeon (KR); Jeong Ik Lee, Daejeon (KR); Hyunsu Cho, Daejeon (KR); Chul Woong Joo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/417,776

(22) Filed: Jan. 27, 2017

(65) Prior Publication Data
US 2017/0250356 A1   Aug. 31, 2017

(30) Foreign Application Priority Data
Feb. 26, 2016 (KR) ........................ 10-2016-0023541

(51) Int. Cl.
*H01L 51/00* (2006.01)
*H01L 51/56* (2006.01)

(52) U.S. Cl.
CPC ........ *H01L 51/0097* (2013.01); *H01L 51/003* (2013.01); *H01L 51/56* (2013.01); *H01L 2251/5338* (2013.01)

(58) Field of Classification Search
CPC ... H01L 51/0097; H01L 51/003; H01L 51/56; H01L 2251/5338
See application file for complete search history.

(56) References Cited

U.S. PATENT DOCUMENTS

| | | | |
|---|---|---|---|
| 9,276,119 B2 | 3/2016 | Oh et al. | |
| 2010/0139750 A1 | 6/2010 | Kim et al. | |
| 2013/0196083 A1* | 8/2013 | Sharma | B23K 26/0084 427/596 |
| 2014/0306324 A1* | 10/2014 | Costa | H01L 23/3737 257/632 |
| 2015/0067882 A1 | 3/2015 | Serret-Avila et al. | |
| 2015/0147854 A1* | 5/2015 | Jung | H05K 1/0283 438/197 |

FOREIGN PATENT DOCUMENTS

KR   10-2015-0020922 A   2/2015

* cited by examiner

*Primary Examiner* — Yasser A Abdelaziez

(57) ABSTRACT

Provided is a stretchable substrate, an electronic apparatus, and a method of manufacturing the electronic apparatus. The stretchable substrate includes a base part, first parts extruded from the base part, and second parts disposed between two adjacent first parts. The second parts have top surfaces positioned lower than the top surfaces of the first parts, and have wrinkles with random distribution.

7 Claims, 5 Drawing Sheets

STRETCHABLE SUBSTRATE, ELECTRONIC APPARATUS HAVING THE STRETCHABLE SUBSTRATE, AND METHOD OF MANUFACTURING THE ELECTRONIC APPARATUS

CROSS-REFERENCE TO RELATED APPLICATIONS

This U.S. non-provisional patent application claims priority under 35 U.S.C. § 119 of Korean Patent Application No. 10-2016-0023541, filed on Feb. 26, 2016, the entire contents of which are hereby incorporated by reference.

BACKGROUND

The present disclosure herein relates to a substrate, an electronic apparatus, and a method of manufacturing the electronic apparatus, and more particularly, to a stretchable substrate, an electronic apparatus including the substrate, and a method of manufacturing the electronic apparatus.

Recently, electronic apparatuses are evolving with a wearable apparatus type. In order to attach the electronic apparatus of the wearable apparatus type, a substrate having properties which may resolve or release stress is required.

SUMMARY

The present disclosure provides a substrate which has a stress released part and is stretchable for forming an electronic apparatus.

The present disclosure also provides an electronic apparatus including the substrate.

The present disclosure also provides a method of manufacturing the electronic apparatus.

The tasks to be solved in present disclosure are not limited to the above-mentioned tasks, and other unmentioned tasks will be clearly understood by a person skilled in the art from the following description.

An embodiment of the inventive concept provides a stretchable substrate. The stretchable substrate includes a base part, first parts extruded from the base part, and second parts disposed between two adjacent first parts and having top surfaces positioned lower than top surfaces of the first parts and having wrinkles with random distribution.

In an embodiment of the inventive concept, an electronic apparatus is provided. The electronic apparatus includes a substrate including first parts and second parts, light emitting devices disposed on each of the first parts of the substrate, and electrical connections disposed on each of the second parts of the substrate and having wrinkles with random distribution.

In an embodiment of the inventive concept, a method of manufacturing an electronic apparatus is provided. The method of manufacturing an electronic apparatus includes forming a mold pattern on a base substrate defining openings configured to partially expose the base substrate and having wrinkles with random distribution; forming a resin for transcription on the base substrate configured to fill up the openings and cover the mold patterns; and curing the resin for transcription to form a substrate including first parts corresponding to the openings and second parts corresponding to the top portion of the mold pattern having the wrinkles with random distribution.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
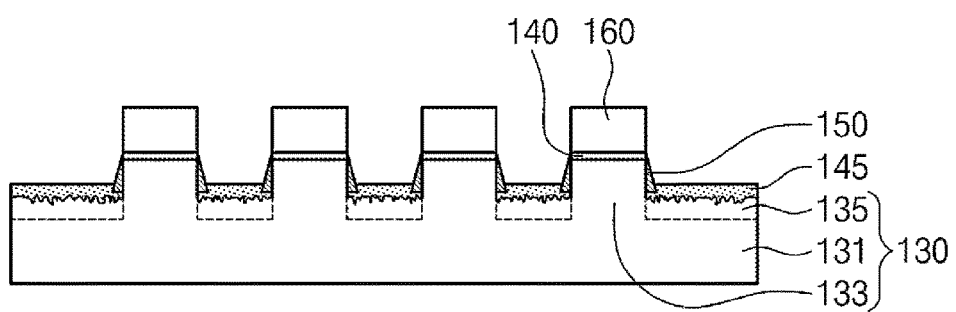
FIG. 1 is a cross-sectional view for explaining an electronic apparatus according to an embodiment of the inventive concept.

Hereinafter, objects, other objects, features and advantages of the inventive concept will be easily understood from preferred embodiments with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when an element is referred to as being "on" another element, it can be directly on or intervening elements may be present. In the drawings, the thicknesses of each element are exaggerated for the convenience of explanation of technical contents.

Example embodiments are described herein with reference to cross-sectional illustrations and/or planar illustrations that are schematic illustrations of idealized example embodiments. In the drawings, the thicknesses of layers or regions are exaggerated for the convenience of explanation of technical contents. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of the present inventive concept. It will be understood that, although the terms first, second, etc. may be used herein to describe various elements, these elements should not be limited by these terms. These terms are only used to distinguish one element from another element. Exemplary embodiments explained and illustrated herein may include complementary embodiments.

The terminology used herein is for the purpose of describing particular example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated elements, but do not preclude the presence or addition of one or more other elements.

Hereinafter, the present invention will be explained in detail with reference to the accompanying drawings.

FIG. 1 is a cross-sectional view for explaining an electronic apparatus according to an embodiment of the inventive concept.

Referring to FIG. 1, the electronic apparatus may include a substrate 130, electronic devices 160 and electrical connections 145 disposed on the substrate 130.

The substrate 130 may include a base part 131, first parts 133 which are extruded from the base part 131, and second parts 135 which are disposed between the first parts 133. The substrate 130 may have transmittance in a visible light band. For example, the substrate 130 may include polydimethylsiloxane (PDMS).

According to an embodiment of the inventive concept, each top surface of the first parts 133 of the substrate 130 may be positioned higher than each top surface of the second parts 135. In addition, each of the second parts 135 may be stretchable. For example, each top surface of the second parts 135 may have wrinkles with random distribution. When the substrate is stretched, the wrinkles with random distribution of the second parts 135 may relieve a stress applied to the substrate. From the cross-sectional view, each of the second parts 135 includes irregularly extruded parts and recessed parts on the upper portion thereof, and due to the structure, the substrate 130 may be stretchable. Each of the first parts 133 may be a region for disposing each of the electronic devices 160, and each of the second parts 135 may be a region for disposing each of the electrical connections 145.

In an embodiment, light emitting devices will be explained for illustrating the electronic devices 160. However, an embodiment of the electronic devices 160 is not limited to the light emitting devices in the inventive concept. Each light emitting device may include an organic light emitting diode. Even though not shown in detail, the light emitting device may have a laminated structure of a first electrode, an organic layer and a second electrode one by one. The first electrode may include a transparent material, for example, a conductive metal oxide, a conductive polymer, or a carbon-based transparent electrode. The organic layer may include a hole transport layer, an organic emission layer, an electron transport layer, etc., and commonly used organic semiconductor, etc. may be used as an organic material. In the organic emission layer, a fluorescent material, a phosphorescent material, or a fluorescent-phosphorescent composite material may be further included. The second electrode may include the same material as the material included in the first electrode and may further include a metal.

The electronic apparatus may further include a planarization layer 140 interposed between the first parts 133 of the substrate 130 and the electronic devices 160. The planarization layer 140 may include an oxide or a crosslinked polymer and may have a thickness of about 10 nm to about 1,000 nm.

Each wiring 145 may include a material having mechanical ductility. For example, the wiring 145 may include at least one of a face centered cubic metal, a conductive polymer or a carbon-based material. The wiring 145 has mechanical ductility and may have wrinkles with random distribution corresponding to the wrinkles with random distribution of the top surface of the second parts 135. From the cross-sectional view, the wiring 145 includes irregularly extruded portions and recessed portions, and due to the structure, the wiring 145 may become stretchable. Therefore, the electronic apparatus may become stretchable and may be bent by external stress.

Connecting patterns 150 electrically connecting each of the electrical connections 145 and each of the electronic devices 160 are provided. Each of the connecting patterns 150 may be disposed on each sidewall of the first parts 133. The connecting patterns 150 may not be stretchable.

Figure 2:
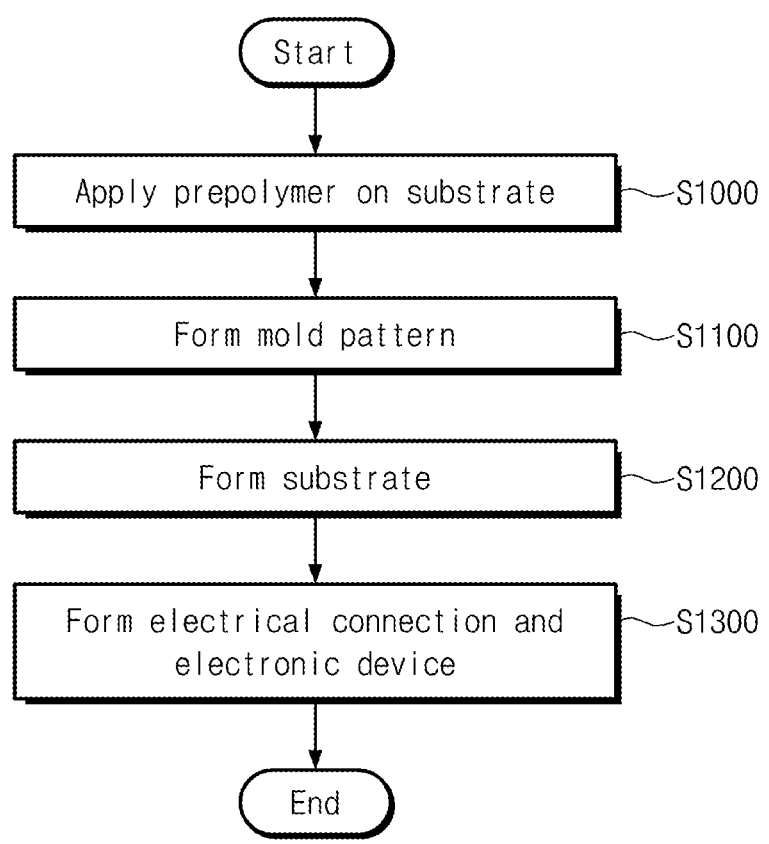
FIG. 2 is a flowchart for explaining a method of manufacturing an electronic apparatus according to an embodiment of the inventive concept.

FIG. 2 is a flowchart for explaining a method of manufacturing an electronic apparatus according to an embodiment of the inventive concept, and FIGS. 3 to 8 are cross-sectional views for explaining a method of manufacturing an electronic apparatus according to an embodiment of the inventive concept.

Figure 3:
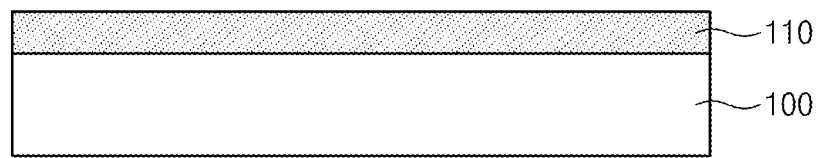
FIGS. 3 to 8 are cross-sectional views for explaining a method of manufacturing an electronic apparatus according to an embodiment of the inventive concept.

Referring to FIGS. 2 and 3, a prepolymer 110 may be applied on a base substrate 100 (step S1000).

The base substrate 100 may include a glass substrate and a substrate with small surface roughness such as a silicon substrate. Before applying the prepolymer 110, the base substrate 100 may be washed to remove minute dusts or organic residues.

According to an embodiment, the prepolymer 110 may be applied on the base substrate 100 by a spin coating, a slot die, or a doctor blade method. The prepolymer 110 may be a liquid phase at room temperature and may have a linear structure. The prepolymer 110 may be a liquid material spontaneously forming wrinkles with random distribution during crosslinking by UV. The prepolymer 110 may include a photocurable material by ultraviolet light. According to an embodiment, two benzene rings may be disposed at both terminals of the prepolymer 110, and two moieties may be combined with the benzene rings. Carbon atoms in the carbon chain connecting the benzene rings at both terminals thereof may be substituted with oxygen atoms. For example, at the carbon atoms excluding the carbon atoms combined with two moieties in the benzene rings at both terminals of the carbon chain, and at the carbon atoms excluding the substituted sites with oxygen in the carbon chain, fluorine atoms may be combined. According to an embodiment, the prepolymer 110 may include families of fluoric styrene molecules. For example, the prepolymer 110 may include the following formula 1 or formula 2.

[Formula 1]

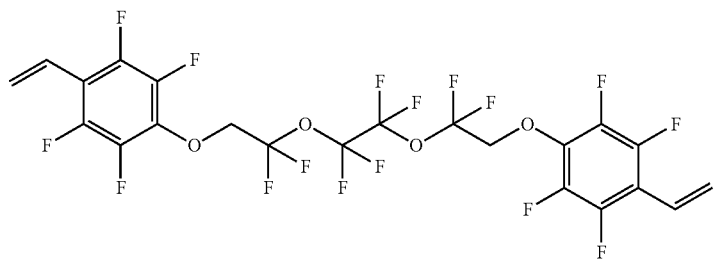

[Formula 2]

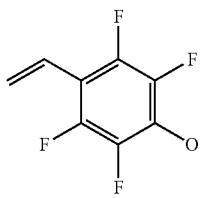 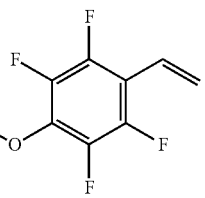

Figure 4:
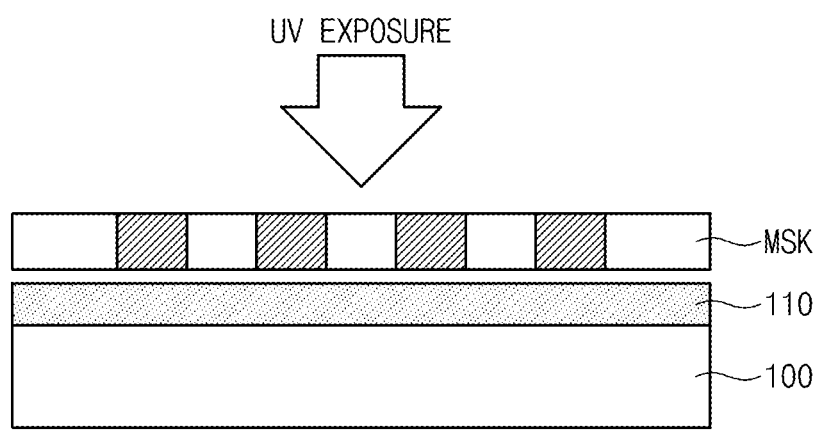
Figure 5:
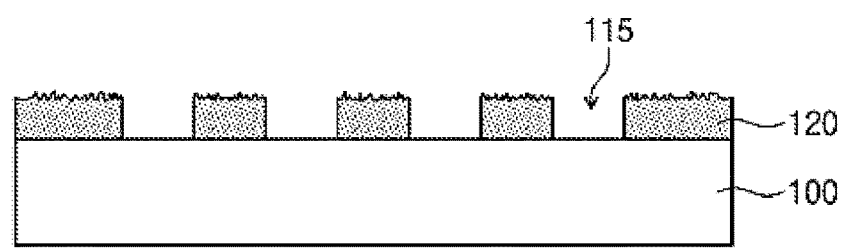

Referring to FIGS. 2, 4 and 5, the prepolymer 110 applied on the base substrate 100 may be partially exposed and crosslinked to form a mold pattern 120 (step S1100).

According to an embodiment of the inventive concept, a mask pattern MSK may be disposed on the prepolymer 110 and exposure to ultraviolet light may be performed. The mask pattern MSK may include quartz which may penetrate ultraviolet light, and a material shielding ultraviolet light may be formed in a desired position in the quartz. The shielding material of ultraviolet light may include chromium, emulsion, iron oxide and silicon.

The prepolymer 110 may include a material which may form an external hard skin first and a relatively soft foundation at the inner portion during crosslinking using ultraviolet light.

The crosslinking process may proceed via the combination among the moieties positioned at both terminals of the prepolymer. The crosslinking process may proceed under an inert atmosphere such as a nitrogen atmosphere or an argon atmosphere. In the case where the crosslinking process proceeds in the air, oxygen may attach to the moieties to inhibit crosslinking. The exposed portion to the ultraviolet light may form the mold pattern 120 having wrinkles with random distribution. The unexposed portion to the ultraviolet light may remain as a liquid phase prepolymer 110 shape. The unexposed portion may be easily removed by an organic solvent. By removing the unexposed portion, openings 115 exposing the surface of the base substrate 100 may be formed between the mold patterns 120. In the cross-sectional view, the top portion of the mold pattern 120 defined by the openings 115 may include irregularly extruded portions and recessed portions.

Figure 6:
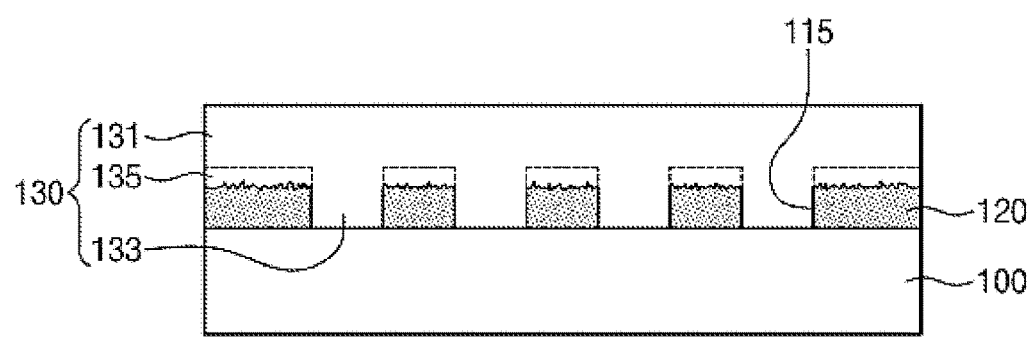

Referring to FIGS. 2 and 6, on the base substrate 100 on which the mold pattern 120 is formed, a resin for transcription (not shown) is applied and cured to form a substrate 130 (step S1200). The resin for transcription may be applied by a drop casting, a slot die, or a doctor blade method. In an embodiment, the resin for transcription may include polydimethylsiloxane (PDMS), however an embodiment of the resin for transcription is not limited thereto, and a material having flexibility and capable of transcription may be sufficient. In addition, the resin for transcription may have transparent properties so as to penetrate light externally.

Figure 7:
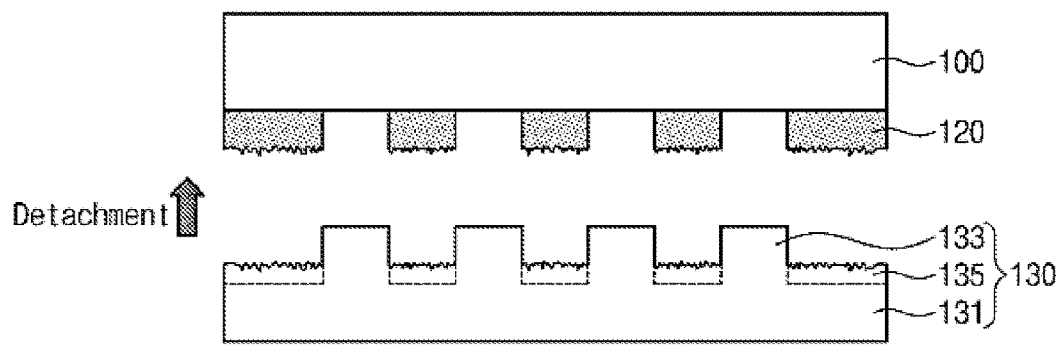

Referring to FIG. 7, after forming the substrate 130 by curing the resin for transcription, the mold pattern 120 may be detached from the substrate 130. The substrate 130 may include a base part 131, first parts 133 extruded from the base part 131, which may be obtained by filling up the openings 115 of the mold pattern 120, and second parts 135 making contact with the wrinkles with random distribution in the mold pattern 120. Each top surface of the first parts 133 may be positioned higher than each top surface of the second parts 135. The second parts 135 may have wrinkles with random distribution by the transcription of the wrinkles with random distribution of the mold pattern 120. On each of the first parts 133, an electronic device 160 may be formed, and on each of the second parts 135, a wiring 145 may be formed. Since the second parts 135 have wrinkles with random distribution, the stress of the wiring pattern 145 may be released.

Figure 8:
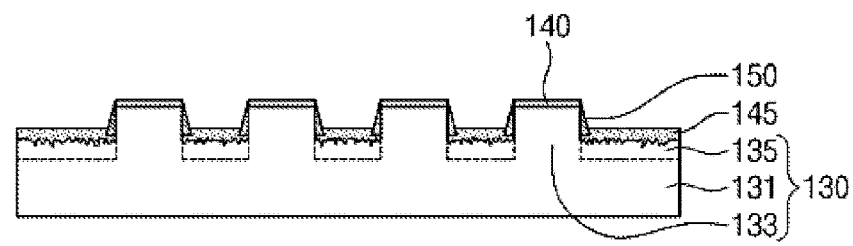

Referring to FIGS. 1, 2 and 8, each of the electronic devices 160 may be formed on each of the first parts 133, and each of the electrical connections 145 may be formed on each of the second parts 135 of the substrate 130 (step S1300).

In detail, first, a planarization layer 140 may be formed on the first parts 133 of the substrate 130. The planarization layer 140 may be formed on the substrate 130 by an atomic layer deposition method or an initiated chemical vapor deposition method. The thickness of the planarization layer 140 may have a range of about 10 nm to about 100 nm. For example, a solution including an insulation material or a polymer may be applied, crosslinked, exposed using a mask pattern MSK, and developed to form the planarization layer 140.

After forming the planarization layer 140, each of the electrical connections 145 may be formed on each of the second parts 135 of the substrate 130. Each of the electrical connections 145 may include at least one of a face centered cubic metal, a conductive polymer or a carbon-based material having mechanical ductility. During forming the electrical connections 145, connecting patterns 150 may be formed on the sidewall of the first parts 133 of the substrate 130 via the stacking of materials included in the electrical connections 145. That is, when the electrical connections 145 are formed, the connecting patterns 150 may be formed at the same time. The connecting patterns 150 may electrically connect each of the electronic devices 160 which will be formed subsequently with each of the electrical connections 145.

In the case where each of the electronic devices 160 includes an organic light emitting diode, an electronic device 160 may be formed by depositing a first electrode, an organic layer and a second electrode on the planarization layer 140 one by one. The first electrode may include a transparent material and may include commonly used conductive metal oxide, conductive polymer or carbon-based transparent electrode. An organic layer formed on the first electrode may include a hole transport layer, an organic emission layer, and an electron transport layer. Selectively, the organic emission layer may include a fluorescent material, a phosphorous material, or a fluorescent-phosphorescent composite material. The second electrode may substantially include the same material as that of the first electrode. Selectively, the second electrode may further include a metal.

By forming the mold pattern 120 according to exemplary embodiments of the inventive concept, the substrate 130 may be manufactured by forming the mold pattern 120 via the exposing and crosslinking of the prepolymer 110, without performing various steps including patterning processes and deposition processes. In addition, since the portions where the electrical connections 145 are formed on the substrate 130 are stretchable, an electronic apparatus with released stress may be manufactured.

According to some embodiments of the inventive concept, an electronic apparatus including electrical connections having wrinkles with random distribution may flexibly handle with external stress. In addition, by forming a mold pattern through exposing and crosslinking a prepolymer, processes including depositing and patterning may be omitted, thereby attaining easy processing.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A stretchable substrate, comprising:
a base part;
first parts extruded from the base part; and
second parts disposed between two adjacent first parts, the second parts having top surfaces positioned lower than top surfaces of the first parts, and having wrinkles with random distribution.

2. The stretchable substrate of claim 1, wherein each of the second part is stretchable.

3. An electronic apparatus, comprising:
a substrate comprising first parts and second parts;
electronic devices disposed on each of the first parts of the substrate; and
electrical connections disposed on each of the second parts of the substrate, the electrical connections having wrinkles with random distribution.

4. The electronic apparatus of claim 3,
wherein the substrate further comprises a base part,
the first parts are extruded from the base part, and
each of the second parts is disposed between two adjacent first parts,
the top surface of each of the second parts being positioned lower than the top surface of each of the first parts.

5. The electronic apparatus of claim 3, wherein each of the second parts has wrinkles with random distribution.

6. The electronic apparatus of claim 3, wherein the substrate further comprises a planarization layer interposed between each of the first parts and each of the electronic devices.

7. The electronic apparatus of claim 3, further comprising connecting patterns disposed on the sidewall of the first parts,
the connecting patterns being configured to electrically connect each of the electronic devices and each of the electrical connections.

* * * * *